United States Patent [19]

Tatsuura et al.

[11] Patent Number: 4,473,935

[45] Date of Patent: Oct. 2, 1984

[54] METHOD FOR SUPPLYING PARTS TO AN AUTOMATIC ASSEMBLING MACHINE

[75] Inventors: Tamiaki Tatsuura; Takeshi Aiba; Takashi Fukushima; Masanori Nishimura; Hiroshi Otsuki, all of Kanagawa; Fujio Yabuki, Saitama; Tomio Kusakabe, Chiba, all of Japan

[73] Assignee: Sony Corporation, Tokyo, Japan

[21] Appl. No.: 387,414

[22] Filed: Jun. 11, 1982

[30] Foreign Application Priority Data

Jun. 16, 1981 [JP] Japan .................................. 56-92581

[51] Int. Cl.³ ...................... B21D 39/03; B23P 11/00
[52] U.S. Cl. .................................... 29/429; 29/33 K; 29/809; 198/472; 206/445; 206/499; 206/563; 221/211; 269/16; 269/47; 414/121
[58] Field of Search ............... 29/429, 33 K, 809, 811; 198/472; 206/445, 499, 563; 269/16, 47; 271/11, 14, 107; 414/121; 221/211; 220/20, 24; 229/2.5

[56] References Cited

U.S. PATENT DOCUMENTS

| 326,141 | 9/1885 | Oaks ................................... 29/809 X |
| 1,672,593 | 6/1928 | Williams ........................... 29/811 X |
| 2,667,999 | 2/1954 | Vore et al. ........................... 221/211 |
| 2,835,406 | 5/1958 | Dickerson ........................ 220/22 X |
| 2,978,707 | 4/1961 | Runciman ........................ 29/809 X |
| 3,212,770 | 10/1965 | Stephens ............................... 269/16 |
| 3,223,127 | 12/1965 | Sidebottom ..................... 220/20 X |
| 3,391,474 | 7/1968 | Hays, Jr. ............................... 29/429 |
| 3,608,770 | 9/1971 | Naimoli ........................... 220/20 X |
| 4,099,325 | 7/1978 | Baker ................................ 29/809 X |
| 4,143,765 | 3/1979 | Moss ..................................... 206/445 |
| 4,147,250 | 4/1979 | Shultz .................................. 198/472 |
| 4,151,636 | 5/1979 | Lauer et al. ..................... 29/736 X |
| 4,164,299 | 8/1979 | Fuhr .................................... 220/20 |
| 4,261,098 | 4/1981 | Lincoln .............................. 29/809 |
| 4,261,555 | 4/1981 | Adams ............................. 269/16 X |
| 4,292,116 | 9/1981 | Takahashi et al. ............. 414/121 X |
| 4,356,909 | 11/1982 | November et al. ................. 198/472 |
| 4,393,579 | 7/1983 | Van Hooreweder ............ 29/809 X |
| 4,403,687 | 9/1983 | Stevens et al. ...................... 198/472 |

*Primary Examiner*—Charlie T. Moon
*Assistant Examiner*—Ronald S. Wallace
*Attorney, Agent, or Firm*—Lewis H. Eslinger; Alvin Sinderbrand

[57] ABSTRACT

A carrier for supplying to an automatic assembling machine at least one chassis and several parts to be assembled on each chassis includes a first portion for receiving each chassis and a second portion associated with the first portion for storing the parts to be assembled on the chassis. According to the method, the chassis are loaded on the first portions of the carrier and sets of corresponding parts are loaded on the second portions in a predetermined relationship, whereupon, corresponding parts of the sets are simultaneously transferred to the respective chassis.

1 Claim, 18 Drawing Figures

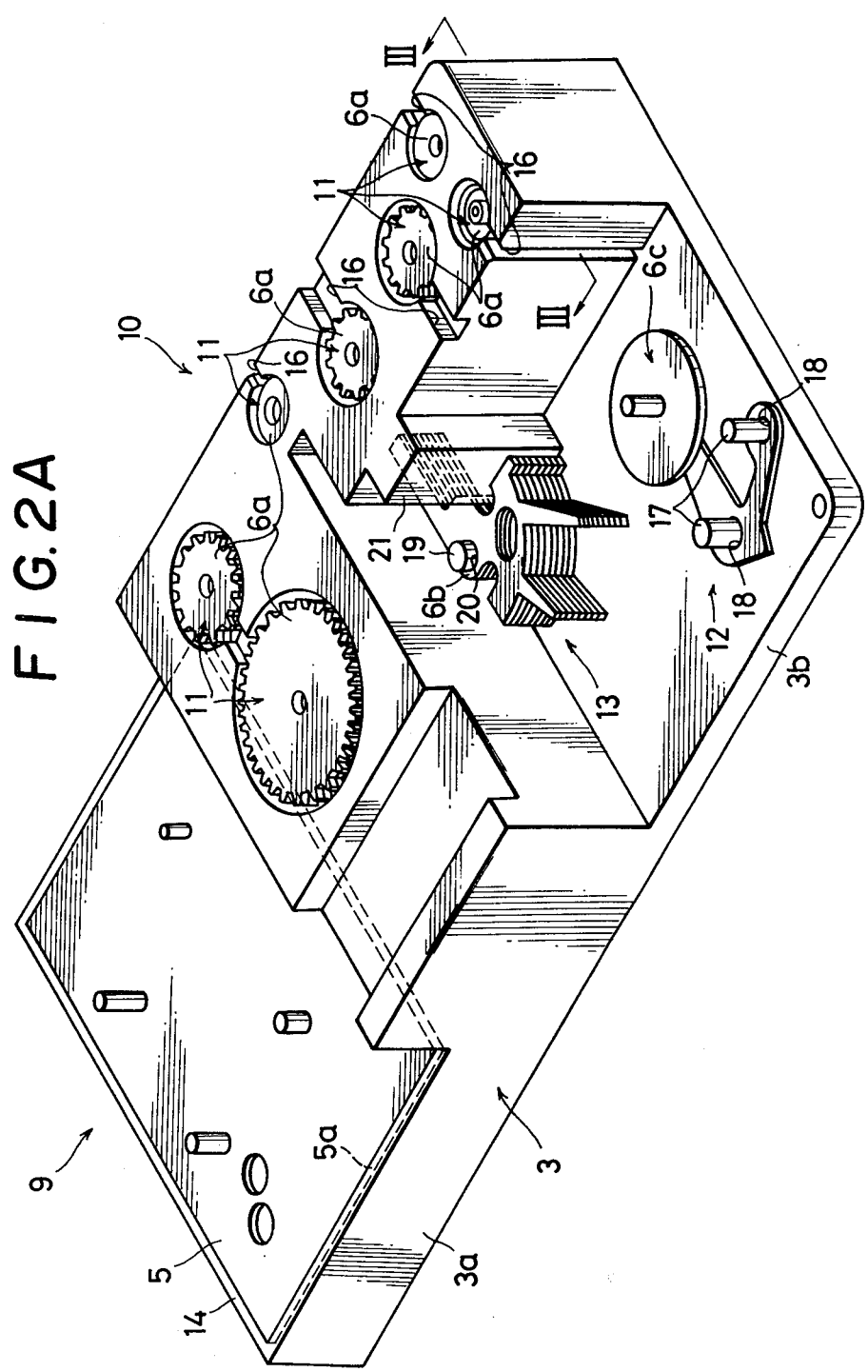

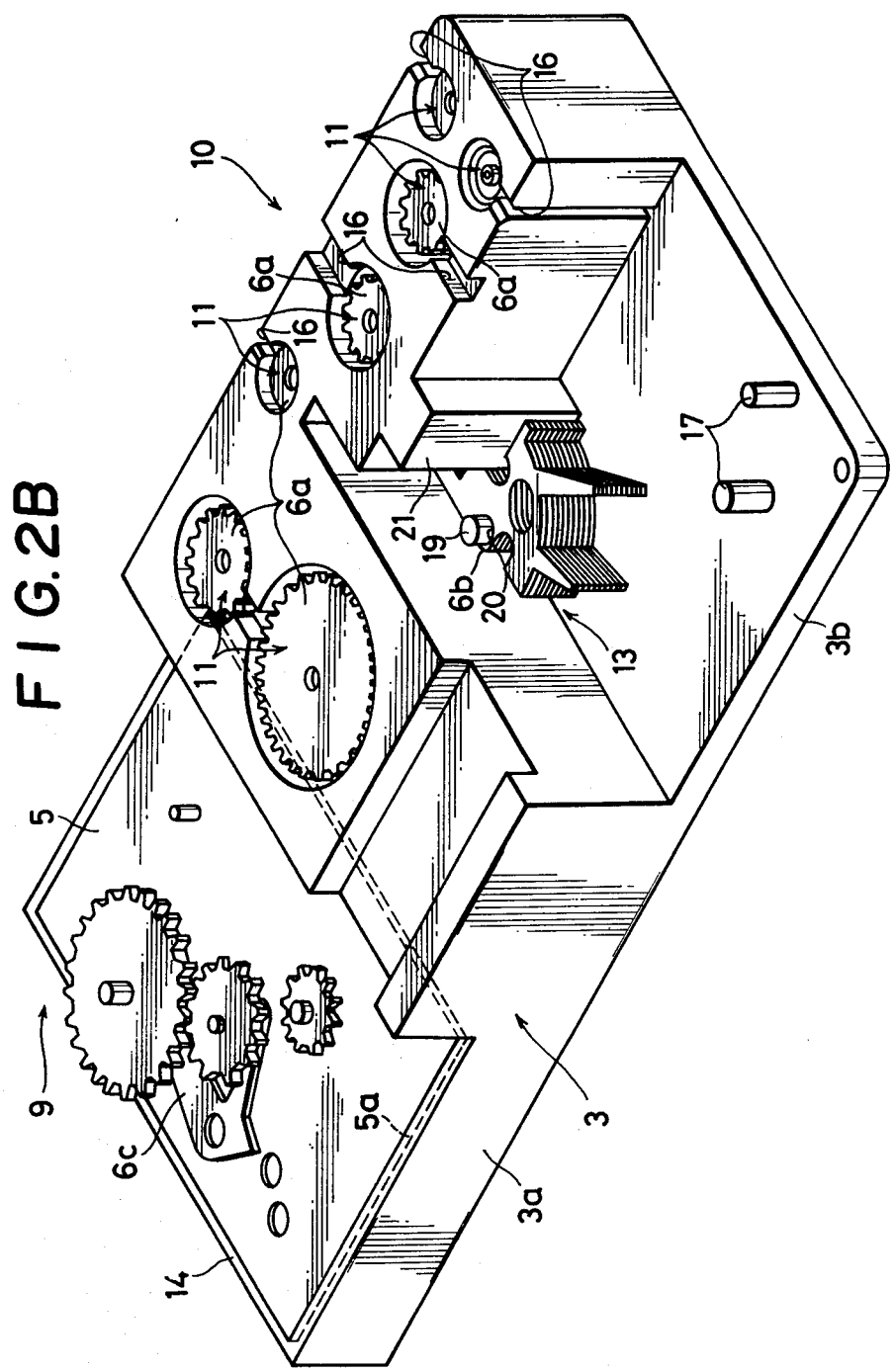

METHOD FOR SUPPLYING PARTS TO AN AUTOMATIC ASSEMBLING MACHINE

CROSS REFERENCES TO RELATED APPLICATIONS

Reference is made to copending U.S. application Ser. No. 380,997 filed May 21, 1982, Ser. No. 390,061 filed June 18, 1982, and Ser. No. 391,472 filed June 23, 1982, assigned to the assignee of the present application, and containing related subject matter.

BACKGROUND OF THE INVENTION

1. Field of the Invention

This invention generally relates to a method and apparatus for supplying parts to be automatically assembled on a chassis by an automatic assembling machine, and more particularly, to a carrier member with pallets for receiving the parts and the chassis for assembly and a method of using the same.

2. Description of the Prior Art

An automatic assembling machine conventionally assembles parts onto a chassis supported by a carrier. Generally, one unit supplies the parts and another unit, distinct from the parts supplier, supplies the chassis to a carrier. The automatic assembling machine sequentially picks up the parts from the parts supplier and assembles them on the chassis transported by the carrier.

However, a complex apparatus is required to assemble many kinds of parts on a chassis with a single automatic assembling machine since each of the different parts requires a respective parts supplying unit and assembly jig. Furthermore, conventional automatic assembling machines are generally constructed to assemble only one type of equipment, that is, only one arrangement of parts on a particular chassis. Accordingly, such automatic assembling machines are special purpose machines which require significant, costly changes when the equipment to be assembled is modified.

OBJECTS AND SUMMARY OF THE INVENTION

Accordingly, it is an object of this invention to avoid the above-described difficulties encountered with the prior art in the automatic assembly of parts on chassis.

More particularly, it is an object of the present invention to provide a device and method by which a chassis and parts to be assembled thereon are supplied to an automatic assembling machine so as to permit the latter to be of simple structure.

It is another object of this invention to provide a device and method by which chassis and parts to be assembled thereon are supplied or carried to an automatic assembling machine so as to permit the latter to have great flexibility to accommodate changes in the design of the products to be assembled.

It is a further object of this invention to provide a device and method, as aforesaid, which causes an automatic assembling machine to produce assemblies with high precision and efficiency.

In accordance with an aspect of the present invention, a device for supplying an automatic assembling machine with at least one chassis and a plurality of parts to be assembled on each chassis includes a carrier member with at least one first portion for receiving each chassis and a second portion associated with each first portion for storing the plurality of parts to be assembled on the chassis.

According to the method of the present invention, when sets of corresponding parts are to be assembled on several respective chassis, such chassis are loaded on respective first portions of a carrier member, and the sets of corresponding parts are loaded on second portions of the carrier member which are respectively associated with the first portions. The various parts of each set are loaded in a predetermined relationship to each other. The corresponding parts of the sets are simultaneously transferred from the second portions to the predetermined locations on the chassis located on the respective first portions.

The above, and other objects, features and advantages of the invention will be apparent from the following detailed description of an illustrative embodiment thereof which is to be read in connection with the accompanying drawings.

BRIEF DESCRIPTION OF THE DRAWINGS

FIGS. 2A and 2B are perspective views before and after the assembling on a chassis of parts carried by respective portions of pallets formed on the carrier member;

DETAILED DESCRIPTION OF A PREFERRED EMBODIMENT

Figure 1:
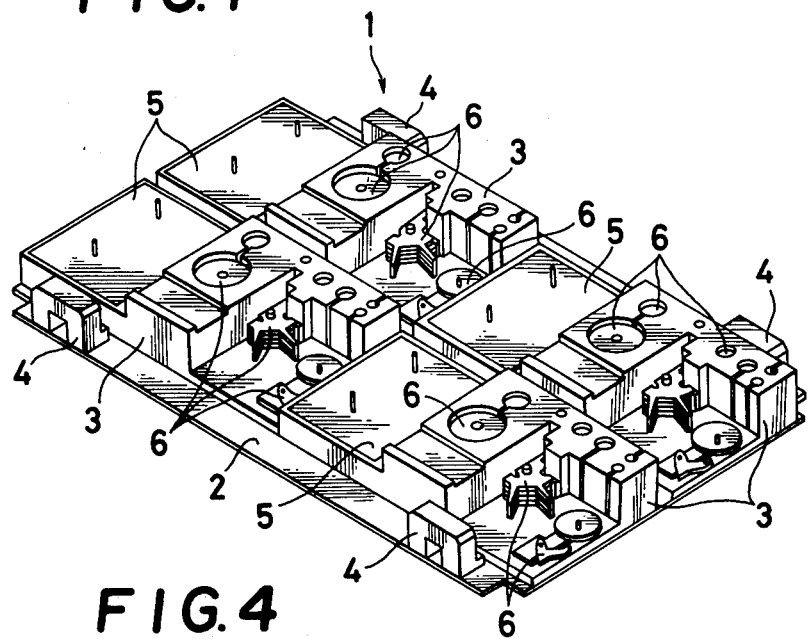
FIG. 1 is a perspective view of a carrier member for use with an automatic assembling apparatus according to the present invention.

Referring to the drawings in detail, and initially to FIG. 1 thereof, a carrier 1 according to an embodiment of this invention for use in an automatic assembling apparatus is shown to include a base plate 2 with four pallets 3 arranged thereon and fixed in alignment with each other. Suspension handles or keepers 4 are respectively mounted adjacent the four corners of the base plate 2.

Each of the pallets 3 of the carrier 1 has positioned thereon before the assembling operation a chassis 5 and main parts 6 which may be various types of gears, levers, bearings and the like required for assembly on the chassis 5. When the carrier 1 is loaded with the chassis 5 and the main parts 6, it is transferred to an assembly center to be described where an automatic assembling machine sequentially picks-up, feeds, and assembles the main parts 6 onto the chassis 5. At the assembly center, common parts and some other parts, such as reel shafts, screws, and the like are separately fed and assembled onto the chassis 5. In addition to the feeding and assembly of the parts on the chassis 5, other operations such as tightening of the screws, lubrication of parts, magnetization of magnetic members, and other associated operations can be automatically performed at the assembly center. The feeding, processing and assembling of the parts on the chassis 5 are simultaneously performed for the four pallets 3 of the carrier.

Figure 3:
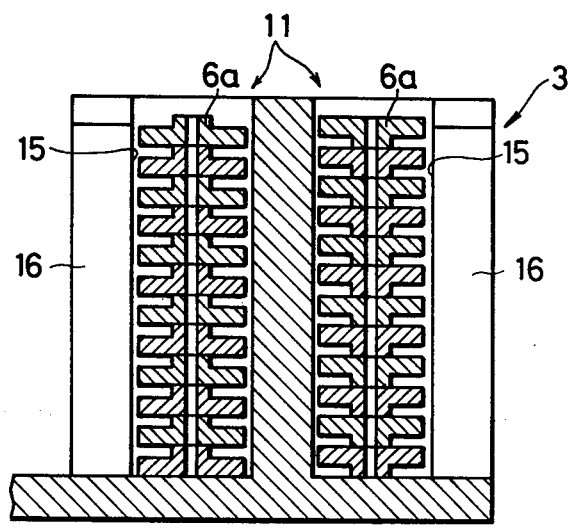
FIG. 3 is a sectional view of a pallet taken along the line III—III of FIG. 2A.

FIGS. 2A, 2B and 3 illustrate in detail the structure of the pallets 3 of the carrier 1. The pallets 3 are molded of a plastic material having high precision such as bulk molding compound (BMC). A chassis positioning loader 9 for positioning and loading the chassis 5 thereon is formed integrally at one end portion 3a of the pallet 3. A parts positioning loader 10 for positioning and loading the parts 6 is integrally formed with the other end portion 3b of the pallet 3. The parts positioning loader 10 includes several parts receiving members 11, 12 and 13 which receive and position respective parts 6a, 6b and 6c.

The chassis positioning loader 9 includes an outer circumference guide portion 14 integrally formed with the pallet 3 and defining a recess which engages part or all of an outer circumference 5a of the chassis 5. The outer circumference guide portion 14 engages and horizontally positions the chassis 5 in the carrier 1. Alternate means for receiving the chassis 5 in the chassis positioning loader 9 will be suggested to those of skill in the art. For example, an engaging part such as a guide pin or a guide hole can be formed integrally with the pallet 3 to engage another engaging part on the chassis 5 such as a hole or a shaft.

The parts 6 stored in the parts positioning loader 10 can be classified into three types. One type, such as parts indicated at 6a, includes various types of gears, bearings and washers which are generally disc-shaped, do not have a predetermined orientation for operation, and can be stacked. A second type of part indicated at 6b includes various types of levers or other members which have a non-circular shape, can be stacked, and have a predetermined orientation for assembly on chassis 5. A third type of part indicated at 6c is in the form of a sub-assembly of several parts which cannot be stacked and also has a predetermined orientation for assembly on chassis 5.

The parts 6a are stacked in the parts receiving members 11, the parts of sub-assembly 6c are positioned or oriented in the parts receiving member 12, and the parts 6b are stacked in the predetermined orientation in the parts receiving member 13.

A cylindrical recess 15 is formed in a raised portion of the pallet 3 to define each of the members 11 which receives a plurality of parts 6a of the same kind. The recess 15 extends vertically in the pallet 3. A slit 16 extends vertically at a side surface of the recess 15. As will be explained more fully hereinbelow, the slit 16 supplies air to the recess 15 to prevent inversion of the parts 6a remaining in recess 15 when the uppermost part 6a is withdrawn. When the parts 6a have holes at the center, guide pins (not shown) can be integrally formed with the pallet 3 for positioning the parts 6a in each recess 15.

The parts 6b with holes 20 formed therein are stacked by inserting a guide pin 19 formed integrally with the pallet 3 through the holes 20. At the same time, portions of the outer circumference of the parts 6b engage outer guide portions 21 comprising recesses formed integrally with the pallet 3 so that the parts 6b are stacked in a predetermined orientation. Thus, in the illustrated embodiment, guide pin 19 and guide portions 21 cooperate to define the parts receiving member 13 for parts 6b. Alternatively, two or more guide pins 19 can be used to engage the outer circumferences of the parts 6b to maintain the parts 6b in the predetermined orientation. In yet another embodiment, pockets or recesses can be formed in the pallet 3 which have the same general configuration as the parts 6b to stack the parts 6b in the predetermined orientation.

The parts of sub-assembly 6c are properly oriented by a plurality of guide pins 17 formed integrally with the pallet 3 to define the parts receiving member 12 and which are inserted in respective holes 18 formed in at least one of the parts 6c. Alternatively, when the parts 6c have ribs at their outer circumferences, three or more guide pins 17 can be formed integrally with the pallet 3 to engage the ribs and defining the parts receiving member 12 for orienting the parts 6c. As explained above in respect to member 13, recesses or pockets can be formed in the pallet 3 to engage the outer circumferences of the parts 6c and thereby define the parts receiving member 12 for properly orienting the parts or sub-assembly 6c.

Figure 4:
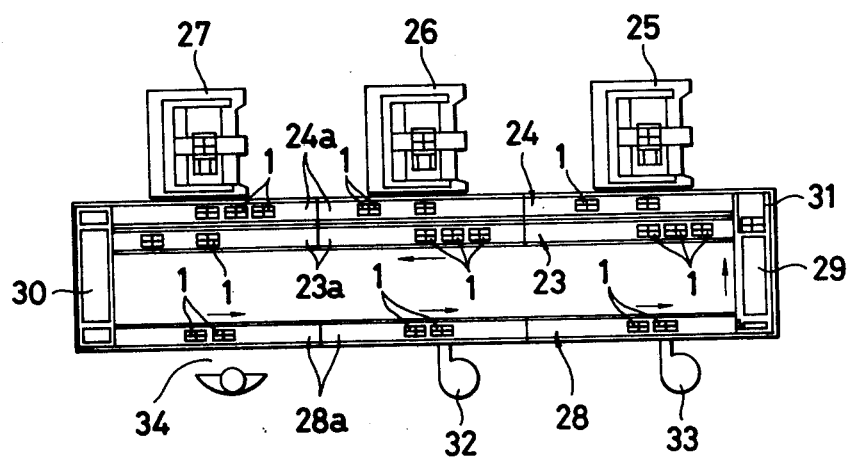
FIG. 4 is a plan view of an automatic assembling apparatus with which carrier members according to the present invention are particularly usable.

An arrangement of conveyers for transporting carriers 1 embodying this invention to and from a number of assembly stations in an automatic assembling apparatus making use of this invention will now be described. In particular, a pair of parallel and adjacent conveyers 23 and 24 are provided to transfer the carriers 1 in the direction of the arrow adjacent to conveyer 23 in FIG. 4. A plurality of assembly centers or stations, for example, three assembly stations 25, 26 and 27 in FIG. 4, are arranged outside of the conveying system adjacent conveyer 24 for performing the feeding, processing and assembling operations with respect to the carriers 1 which are transported by conveyers 23 and 24 to and from the various assembly stations 25, 26 and 27.

In addition, another conveyer 28 is spaced from and parallel to conveyer 23, and a pair of conveyers 29, 30 are provided for connecting the respective ends of the conveyer 28 to the corresponding ends of conveyers 29, 30. In this regard, conveyers 23, 24, 28, 29 and 30 define an endless conveyer line, with carriers 1 being transferred by the endless conveyer line in the direction indicated by the arrows in FIG. 4. The conveyers may be formed by any suitable conveyer system, for example, the conveyers may be comprised of roller conveyers, that is, each conveyer being comprised of a plurality of rotatable rollers over which carriers 1 travel. In this regard, carriers 1 can be stopped at any position along the conveyers by means of appropriate stopping members interposed in their path and can immediately resume their travel upon release of the stopping members. Conveyers 23, 24 and 28 are each divided into a plurality of short conveying sections, 23a, 24a and 28a, respectively, each conveying section corresponding to a respective one of the assembly stations. In this manner, independent feeding and discharging of carriers 1 with respect to assembly stations 25, 26 and 27 can be easily accomplished.

A distributor 31 is arranged at the front end of the conveyer 29, that is, the end adjacent conveyers 23 and 24, for selectively feeding carriers 1 to either conveyer 23 or conveyer 24, as will be apparent hereinafter. In addition, loading stations 32, 33 are arranged at, for example, two downstream positions of conveyer 28 for supplying carriers 1 to the conveying system, and an unloading station 34 is arranged at the upstream position of conveyer 28 for removing from the conveying system those carriers on which the chassis 5 and respective parts 6 have been assembled together. In this manner, four chassis 5 and associated parts 6 to be assembled thereon are placed on each carrier 1, and the latter are then supplied to the respective loading stations 32, 33 where they are transferred to the conveyer 28. The conveyer 28 then moves the carrier 1 to the conveyer 29, where the distributor 31 selectively feeds the carriers 1 to either the conveyer 23 or the conveyer 24 according to a preset distribution arrangement. The carriers 1 can then be transferred or fed to a first assembly station 25 by the respective conveyer 23 or 24. In particular, the carriers 1 from the conveyer 23 and the conveyer 24 are transferred to the assembly station 25 by a carrier loader thereat, which will be described in more detail hereinafter, and placed on a movable table of assembly station 25, where feeding, processing and assembling operations of the parts 6 on the chassis 5 are automatically performed. Upon completion of the above operations, the carriers 1 are discharged onto one of the conveyers 23, 24 by the carrier loader to be transferred to the next assembly station 26. It is to be appreciated that the carrier loader is movable between a first position in opposing relation to the movable table of assembly station 25 and a second position in opposing relation to the conveyers 23, 24. Feeding and discharge of the carriers 1 with respect to the assembly stations 26, 27 at downstream positions of conveyers 23, 24 are performed in a similar manner. Upon completion of the above operations with respect to the assembly station 27, the carriers are transferred to unloading station 34 by the conveyers 30 and 28 and there unloaded from the conveyer 28, for example, by an operator. The various steps of the operation may be easily varied by switching the feeding and discharge lines of the carriers 1 at the assembly stations 25, 26 and 27 by means of the conveyers 23 and 24.

Figure 5:
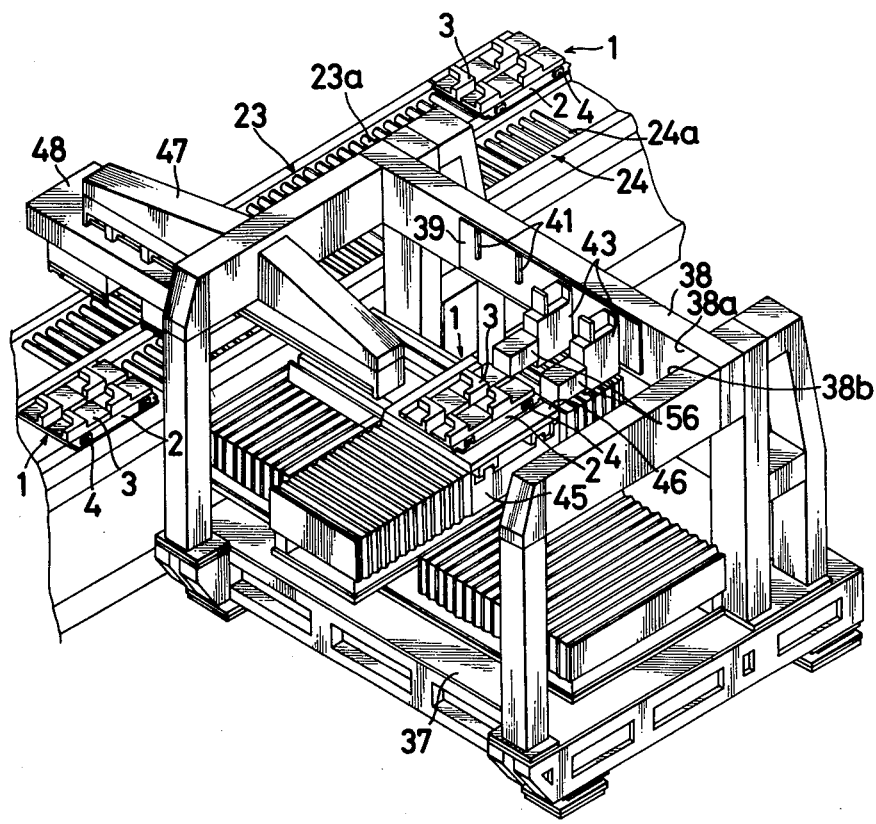
FIG. 5 is a perspective view of an assembly center or station.
Figure 6:
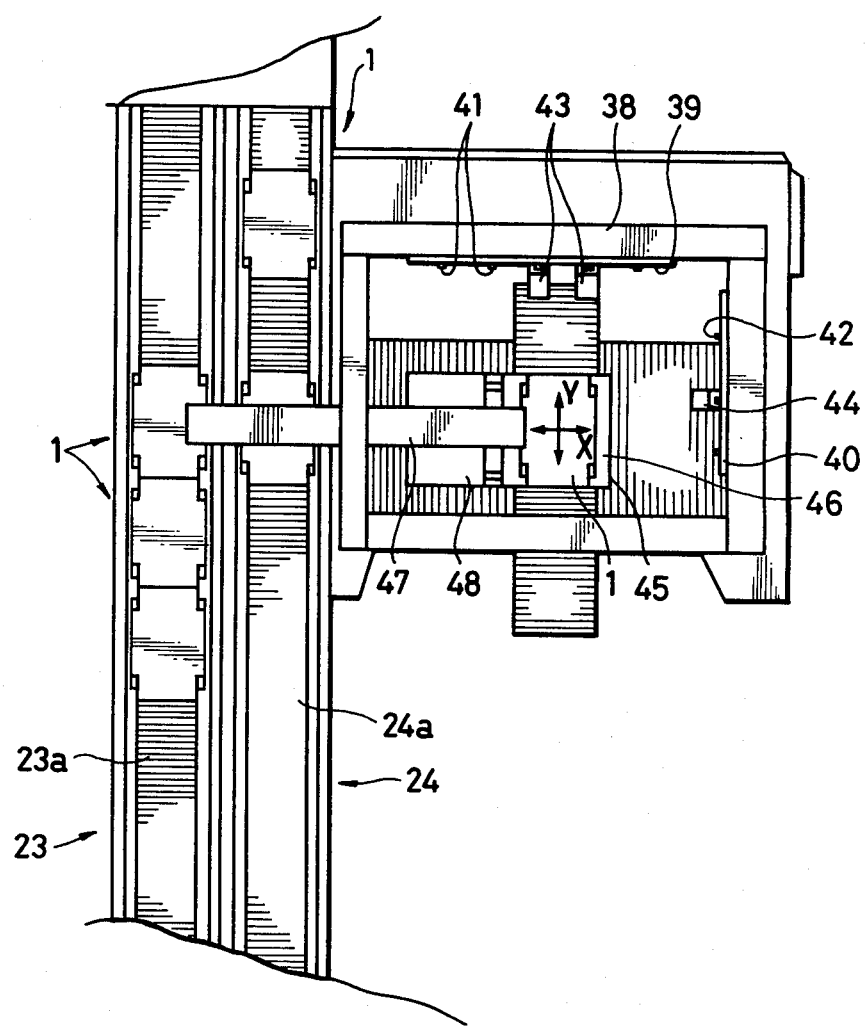
FIG. 6 is a plan view of the assembly center of FIG. 5.
Figure 7:
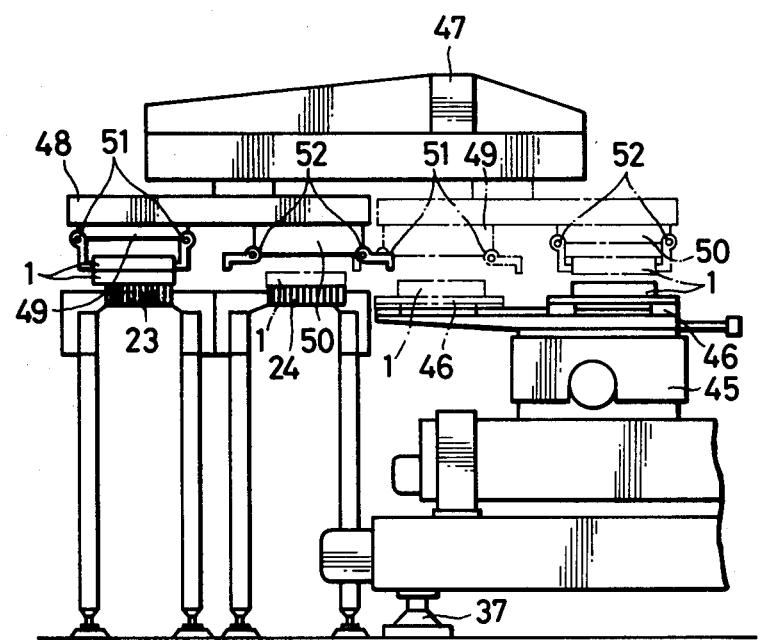
FIG. 7 is an end elevational view of a carrier loader as part of an assembly center of the automatic assembling apparatus of FIG. 4.

Referring now to FIGS. 5, 6 and 7, the construction of the assembly station 25 will now be described. It is to be appreciated, however, that the assembly stations 26 and 27 may also be of the same construction. In particular, the assembly station 25 includes a horizontal, substantially U-shaped mounting beam 38 supported by vertical members above a horizontal base 37 and parallel to the latter. The inner side surfaces 38a, 38b of the connecting segment, and a leg, respectively, of U-shaped mounting beam 38 have mounting plates 39, and 40, respectively, secured thereto, mounting plates 39 and 40 therefore being perpendicular to each other. A plurality of keys 41 are vertically mounted on the mounting plate 39 and are spaced from each other at predetermined intervals in the direction of the X-axis, that is, the horizontal direction along surface 38a. In a like manner, a plurality of keys 42 are vertically mounted on the mounting plate 40 and are spaced from each other at predetermined intervals in a Y-axis horizontal direction. Working units 43 and 44 are mounted on selected ones of the keys 41 and 42, respectively, and can be easily removed from one key and mounted on another key. The working units include working heads mounted on the lower ends of the working units 43 and 44 which are vertically reciprocable.

A movable table 45 is mounted on base 37 and is adapted to be driven in the X-axis and Y-axis directions in the horizontal plane of the base 37, as shown in FIG. 6, and a shift table 46 is also horizontally reciprocable within a limited range in the X-axis direction on the movable table 45. It is to be appreciated that the feeding, processing and assembling operations with respect to the carrier 1 and the four chassis 5 thereon occur on the shift table 46. It is to be further appreciated, however, that the shift table 46 is provided to minimize the movements of the table 45 and thereby provide a compact machine, but may be eliminated if desired. In that case, all movements of a carrier 1 would be affected by the movements of table 45.

A loader guide 47 is horizontally suspended from the other leg of mounting beam 38 amd extends in the X-axis direction, and a carrier loader 48 is slidably mounted to the underside of the loader guide 47 for horizontal reciprocable movement in the X-axis direction between a first position in opposing relation to the upper surface of the movable table 45 of the assembly station 25 and a second position in opposing relation to the upper surfaces of the conveyers 23 and 24. The carrier loader 48 includes first and second chucking stations 49 and 50 (FIG. 7), which will be discussed in greater detail hereinafter, and which are in opposing relation to the conveyers 23 and 24, respectively, when the carrier loader 48 is moved to its second position. The chucking stations 49 and 50 are used for transferring the carriers 1 between the conveyers 23 and 24 and the shift table 46, and accordingly, the chucking stations 49 and 50 include four suspension pawls 51 and 52, respectively, for engaging with the four suspension keepers or handles 4 of each carrier 1 to lift the carriers 1 from the conveyers 23 and 24 or the shift table 46.

The conveyer 23 transfers each carrier 1, prior to the assembly operation, to a position opposite assembly center 25, and at which carrier loader 48 is positioned as indicated by the solid lines in FIG. 7. The suspension pawls 51 of one chucking station 49 of the carrier loader 48 engage the keepers 4 on the carrier 1 to lift the carrier 1 from the conveyer 23. The carrier loader 48 then moves to the position shown in broken lines on FIG. 7 so as to move carrier 1 from a position over the conveyer 23 to a position over the moving table 45 in the assembly center 25. When shift table 46 is moved to the position shown in broken lines, that is, below chucking station 49, carrier 1 is released by the latter and lowered onto shift table 46. The moving table 45 is next moved in the X-axis direction and the Y-axis direction according to a predetermined control program or procedure while working heads of the working units 43 and 44 are vertically moved in synchronism with the movements of moving table 45 to perform the feeding, processing and assembly of the main parts 6 on each chassis 5 and any other associated operations. During these assembling and related operations, the carrier loader 48 is positioned above the conveyers 23 and 24, as indicated by the solid lines of FIG. 7, so as to avoid interference with movements of working units 43 and 44. After the assembly operations have been performed to assemble the parts 6 on each chassis 5, shift table 46 is moved to the position shown in full lines on FIG. 7, and carrier loader 48 is moved to the position shown in broken lines for disposing chucking station 50 above shift table 46 supporting the carrier 1 on which assembly operations have been performed, while a new carrier 1, on which assembly operations are to be performed, is suspended from pawls 51 of chucking station 49. The chucking station 50 then lifts the carrier on which assembly operations have been performed, and the empty shift table 46 is returned to the position shown in broken lines under chucking station 49 to receive from the latter the new carrier 1 on which assembly operations are to be performed.

Upon the return of carrier loader 48 to the position shown in full lines on FIG. 7, chucking station 50 is disposed above conveyer 24 and its pawls 52 are released to lower onto conveyer 24 the carrier 1 which assembly operations have been performed at assembly center or station 25. At the same time, another carrier 1 on which assembly operations are to be performed is engaged by pawls 51 of chucking station 49 and lifted from conveyer 23 in preparation for the next operating cycle at station 25.

It will be appreciated that the successive carriers 1 on which assembly operations are to be performed are brought to station 25 on conveyer 23, and, after performance of such assembly operations, each carrier 1 is transported away from station 25 on conveyer 24 to the next assembly center or station 26 where a similar cycle of operations is performed. However, at such station 26, the carriers 1 on which assembly operations are to be performed are drawn from conveyer 24 and thereafter returned to conveyer 23 for further transport to the last assembly center or station 27.

Figure 8A:
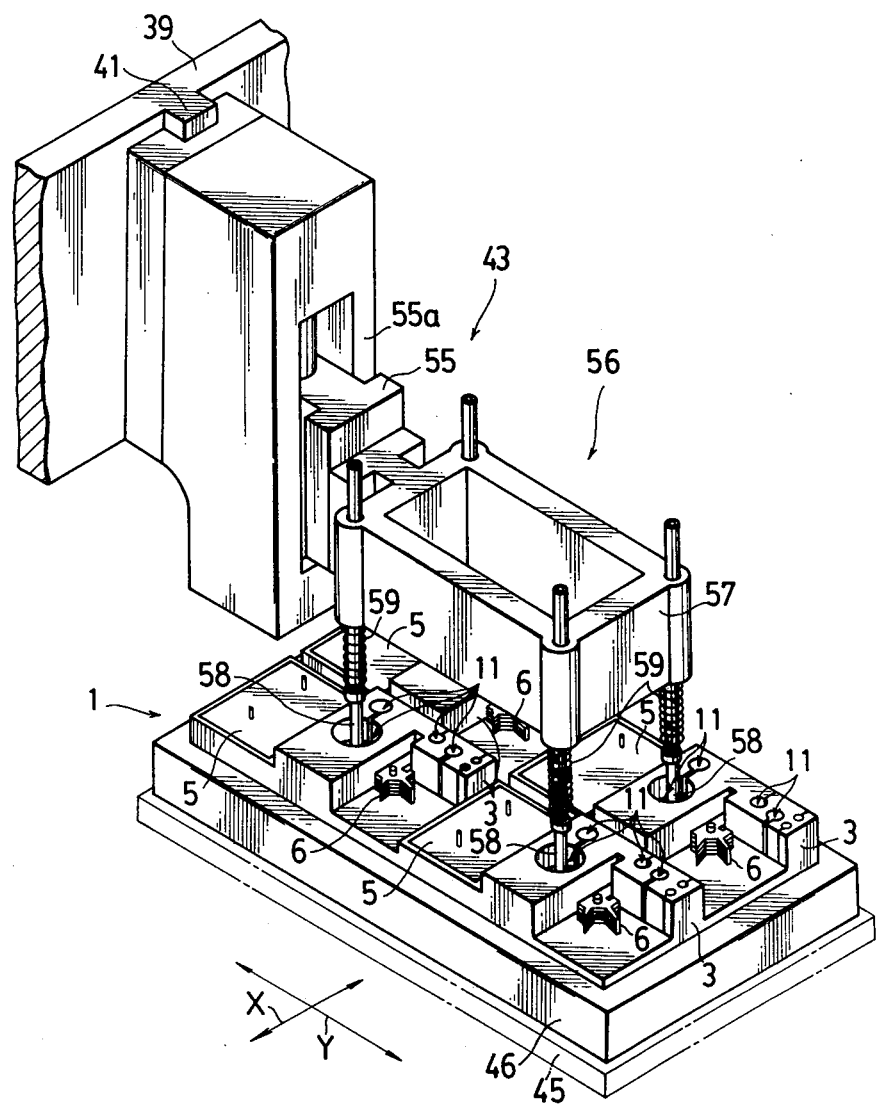
FIGS. 8A and 8B are perspective views illustrating an assembly operation on a carrier member by a working unit.
Figure 8B:
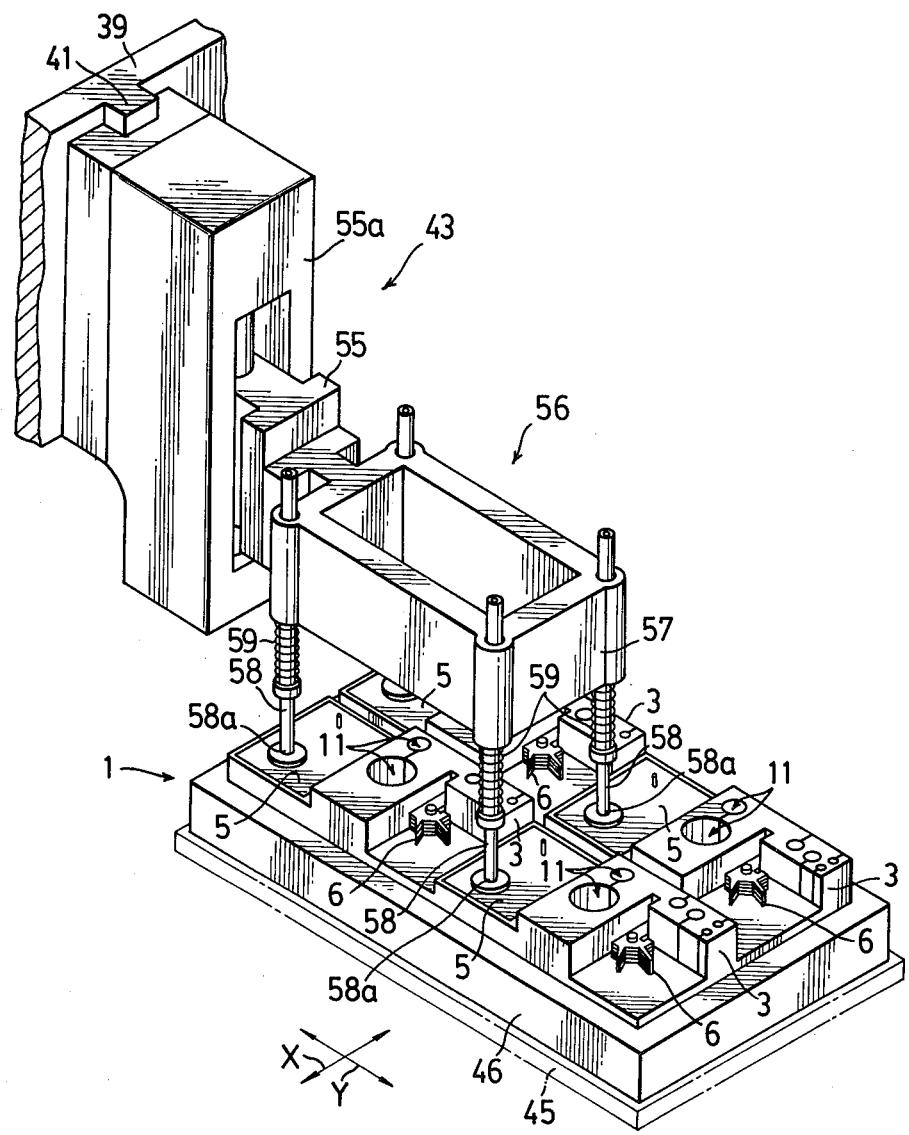

Reference will now be made to FIGS. 8A and 8B in explaining the nature of the work units 43, 44 that are provided at each of the assembly centers or stations 25, 26 and 27 for assembling parts 6 on each related chassis 5 and performing other associated operations. As shown in respect to work unit 43, a lift base 55 is vertically reciprocable relative to a mounting member 55a which is secured on a respective key 41 on plate 39.

A working head 56, which may be of various types, is mounted on a front surface of the lift base 55 so that the working head 56 may be interchanged. In the illustrative embodiment, head 56 includes a head holder 57 which has four chucking heads 58 extending downwardly therefrom. The four chucking heads 58 are positioned with a predetermined distance therebetween corresponding to the distances between corresponding locations on the four pallets 3 of the carrier 1. In an exemplary embodiment, the chucking heads 58 are connected to a vacuum pump (not shown) and can lift the main parts 6 by the suction of air through openings 58b formed in their lower end portions 58a. The chucking heads 58 are elastically urged downwardly relative to holder 57 by compression springs 59 mounted in surrounding relationship to chucking heads 58.

At each of the assembly centers 25, 26 and 27, when a carrier 1 is placed on the shift table 46 mounted on the respective movable table 45, such carrier 1 is movable in the X-axis and Y-axis directions shown on FIGS. 8A and 8B relative to heads 58, by movement of the movable table 45 in the X-axis and Y-axis directions. Accordingly, the four chassis 5 and the corresponding parts 6 on the four pallets 3 of the carrier 1 are simultaneously positioned with respect to the four chucking heads 58 of the working head 56.

Figure 9A:
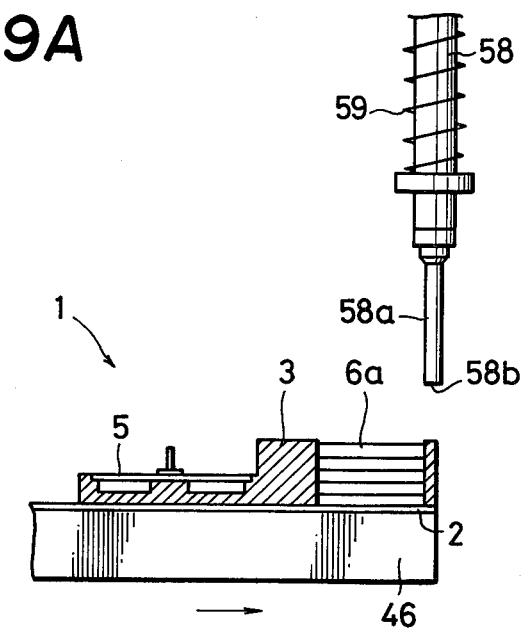
FIGS. 9A–9G are side views illustrating the operation of the working heads and a movable table during an assembly operation.
Figure 9B:
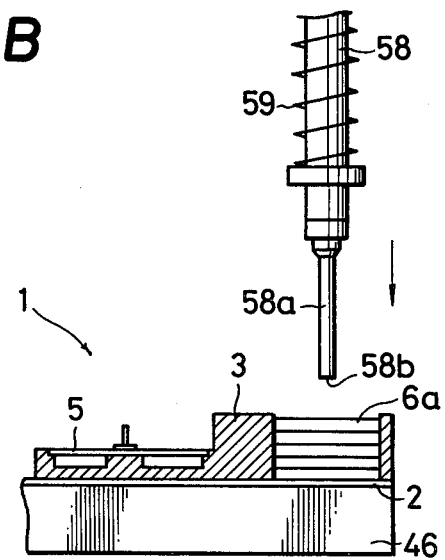
Figure 9C:
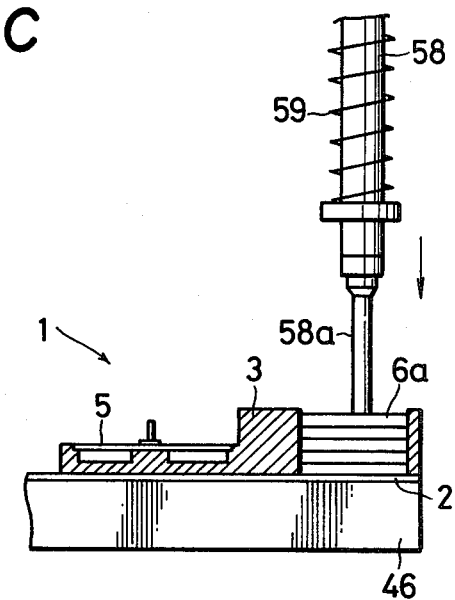
Figure 9D:
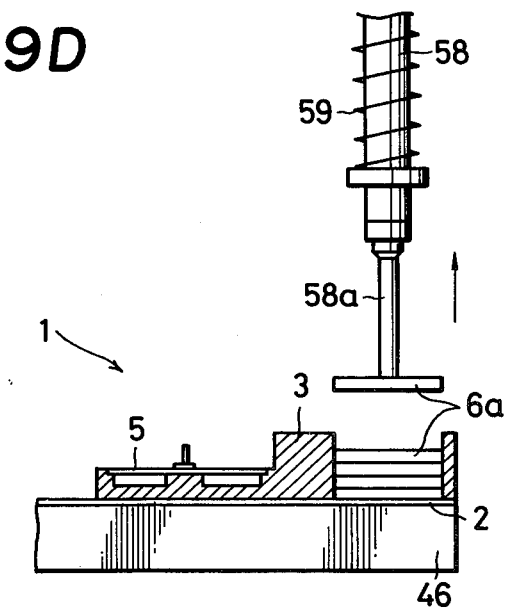

For example, by movement of carrier 1 in the direction indicated by the arrow on FIG. 9A, each chucking head 58 is respectively positioned over a corresponding part 6 on the respective pallet 3 of the carrier 1, as shown on FIG. 9B. As illustrated in FIGS. 8A and 9C, downward movement of lift base 55 of working unit 43 then lowers the working head 56 so that the lower ends 58a of the chucking heads 58 are elastically urged by springs 59 against the respective parts 6a. The suction draws the uppermost parts 6a in the stacks thereof to the lower ends 58a. As shown in FIG. 9D, each chucking head 58 of working head 56 subsequently lifts the respective part 6a in response to upward movement of the lift base 55.

Figure 10:
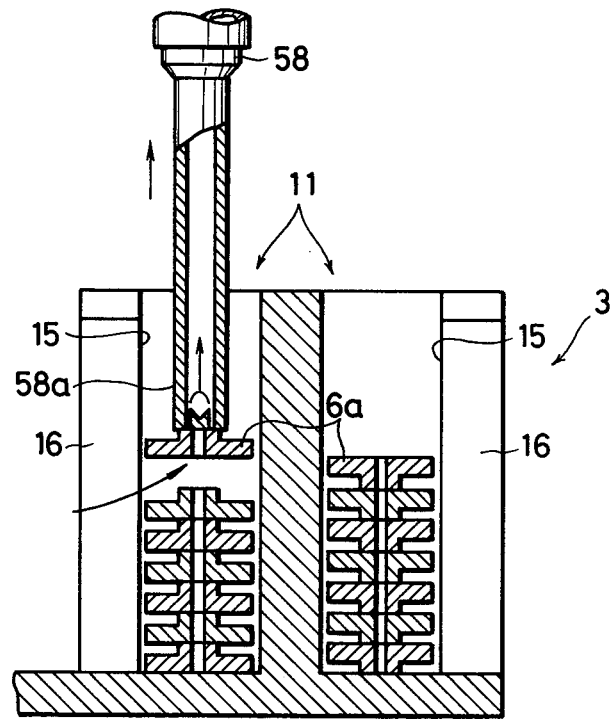
FIG. 10 is a sectional view illustrating a parts drawing operation by a chucking head of a parts stacking loader during an assembly operation.

As illustrated in FIG. 10, the guide recesses 15 contain stacks of the parts 6a which have a relatively small diameter and which are relatively light in weight, such as washers. During the lifting of each uppermost part 6a by a chucking head 58, the interior of the recess 15 under the lifted part 6a is placed under a low pressure by the piston phenomenon resulting from the close fit of the lifted part in recess 15. In the absence of the slits 16 opening laterally into recesses 15, such low pressure under the uppermost part 6a would cause the next lower part 6a to be lifted upwardly and possibly toppled. The slits 16 prevent such toppling or inversion of the parts 6a by supplying air to the recesses 15 under the lifted uppermost part. The slits 16 also prevent a change in the orientation or tilt of the next part 6a which would block the suction action in the next operation of the chucking head 58.

Figure 9E:
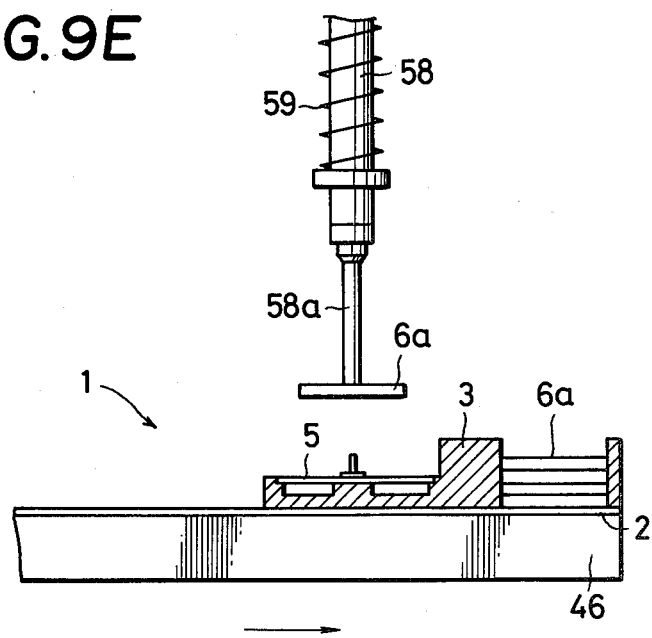

The positions of the chucking heads 58 in the X-axis and Y-axis directions with respect to the chassis 5 placed on the four pallets 3 of the carrier 1 are determined by further suitable movements of the movable table 45. Consequently, the chucking heads 58 are positioned at the assembled positions of the previously lifted parts 6a on the respective chassis 5, as shown in FIG. 9E.

Figure 9F:
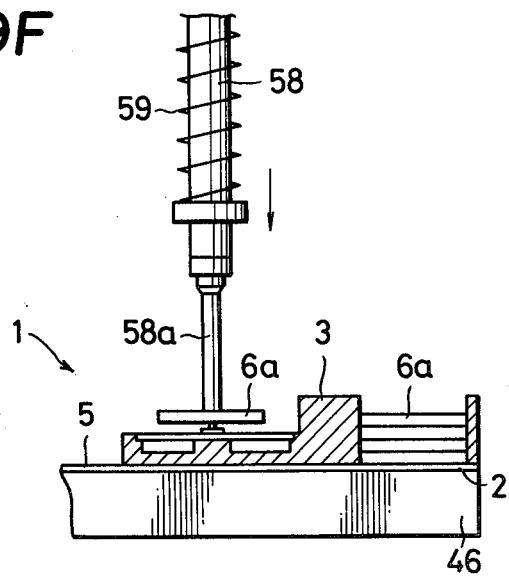
Figure 9G:
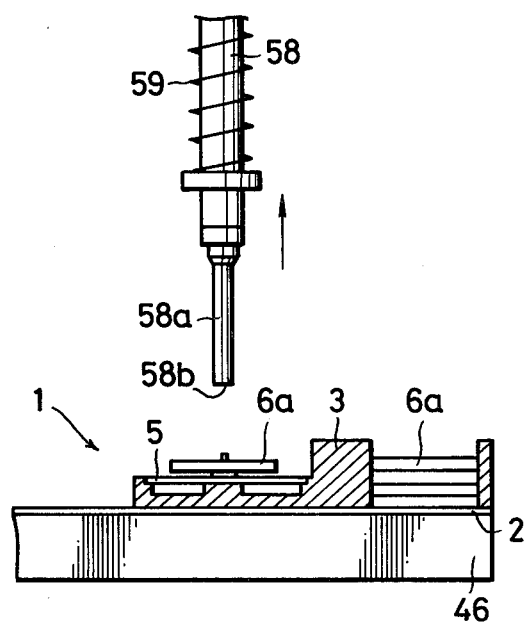

As shown in FIGS. 8B and 9F, the lift base 55 is moved downwardly and lowers the working head 56 whereby the parts 6a adhered by suction to the lower ends 58a of the chucking heads 58 are elastically urged to their assembled positions on the respective chassis 5 to be assembled thereon. Then, the suction applied to the chucking heads 58 is released so that the parts 6a are detached from the lower ends 58a of the chucking heads 58 and remain in this assembled position on chassis 5, as illustrated in FIG. 9G, when the lift base 55 lifts the working head 56 to its initial position where it is ready for the next assembly operation cycle.

A suitably programmed computer or microprocessor can be utilized to conventionally control pneumatically or otherwise powered movements of the movable table 45 in the X-axis and Y-axis directions, vertical movements of working head 56, and the movements of carrier loader 48 during the assembly of the parts 6 on each chassis 5. In such case, changes in the design or type of articles to be assembled are easily accommodated by rewriting and storing a control program in the computer. In the event of such changes, the parts feeding units, the assembly jigs and the like at the assembly stations or centers 25, 26 and 27 need not be modified. An automatic assembling machine is thus made very flexible and can serve for many different assembling operations if the parts to be assembled are carried thereto in accordance with the present invention.

In addition to the working unit 43 described hereinbefore, other working units can be incorporated at the respective assembly centers 25, 26 and 27 for performing, for example, the tightening of screws, the mounting of polygrips and polywashers, the lubrication of parts, the magnetization of magnetic members, and the assembly and processing of other commonly used parts, and the like. These operations can be performed in association with control of the movement of the movable table 45 in the X-axis and Y-axis directions as hereinbefore described.

The number of feeding units and assembly jigs for the parts 6 at the assembly centers 25, 26 and 27 can be significantly reduced since each chassis 5 and the parts 6 to be assembled thereon are fed onto a carrier 1 and then transferred to the assembly centers 25, 26 and 27 where the predetermined assembly operations are performed.

Since each chassis 5 and the respective parts 6 are positioned on the carrier 1, the movable table 45 at each of the assembly centers 25, 26 and 27 need only control the horizontal movement of the carrier 1 in the X-axis and Y-axis directions. Many kinds of parts 6 can be efficiently mounted on the chassis 5 since only simple vertical movements of the working heads 56 of the working units 43 and 44 are required, and the vertical movements of the working heads 56 can be easily controlled by a suitably programmed computer or microprocessor.

Since some of the parts 6 which are stacked on each pallet 3 of a carrier 1 at the loading stations 32 and 33 are the same, the number of parts loaded onto a pallet of carrier 1 can exceed the number of parts required for one chassis. The number of loading operations for the parts 6 can thus be significantly reduced. The parts 6a and 6b which are to be retained in stacks by receiving members 11 and 13 can be supplied thereto in the form of stacks on, for example, a string, a rod, or in a magazine. Accordingly, the time for stacking and loading the parts 6a, 6b and 6c on the carrier 1 can be significantly reduced.

The parts 6b and 6c which must be assembled in a predetermined orientation on a chassis 5 can be supplied to the assembly centers or stations 25, 26 and 27 in that predetermined orientation by being suitably positioned relative to carrier 1 before the latter is transferred or conveyed to the assembly centers 25, 26 and 27. The assembling operation is thus much easier than in the prior art since the working heads 56 of the working units 43 and 44 only lift and lower parts which are supplied in the proper predetermined orientation and, therefore, do not require turning.

Having described a specific preferred embodiment of the invention, it is to be understood that the present invention is not limited to that precise embodiment, and that various changes and modifications may be made therein by one skilled in the art without departing from the spirit or scope of the invention as defined in the appended claims.

What is claimed is:

1. A method of assembling, on a plurality of chassis, respective sets of corresponding parts at least some of which are different from each other comprising the steps of:

loading a plurality of chassis on respective first portions of a carrier member in a predetermined relationship;

loading said sets of corresponding parts on second portions of said carrier member respectively associated with said first portions and in each of which said corresponding parts are loaded in another predetermined relationship to each other;

conveying said carrier member from a loading station, at which said loading of said chassis and sets of corresponding parts are effected, to a parts assembly station; and while said carrier member is situated at said parts assembly station, simultaneously transferring said corresponding parts of said sets from said second portions to predetermined locations on said plurality of chassis on said respective first portions by an automatic assembling machine at said parts assembly station.

* * * * *